(12) United States Patent
Lehee

(10) Patent No.: US 10,703,626 B2
(45) Date of Patent: Jul. 7, 2020

(54) DAMPING SYSTEM FOR A MOBILE MASS OF A MEMS DEVICE

(71) Applicants: SAFRAN, Paris (FR);
COMMISSARIAT A L'ENERGIE ATOMIQUE ET AUX ENERGIES ALTERNATIVES, Paris (FR)

(72) Inventor: Guillaume Jerome Francois Lehee, Moissy-Cramayel (FR)

(73) Assignees: SAFRAN, Paris (FR);
COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/462,613

(22) PCT Filed: Nov. 20, 2017

(86) PCT No.: PCT/FR2017/053166
§ 371 (c)(1),
(2) Date: May 21, 2019

(87) PCT Pub. No.: WO2018/091851
PCT Pub. Date: May 24, 2018

(65) Prior Publication Data
US 2020/0062584 A1    Feb. 27, 2020

(30) Foreign Application Priority Data

Nov. 21, 2016 (FR) ...................................... 16 61296

(51) Int. Cl.
*H01L 29/82*    (2006.01)
*B81B 7/00*    (2006.01)
*B81B 3/00*    (2006.01)

(52) U.S. Cl.
CPC .......... *B81B 7/0016* (2013.01); *B81B 3/0051* (2013.01)

(58) Field of Classification Search
CPC ......... H01L 2924/1461; H01L 25/0657; B81B 7/02; B81B 7/0048; B81B 3/0051; B81B 7/0016; B81B 7/008
(Continued)

(56) References Cited

U.S. PATENT DOCUMENTS 7,194,889 B1    3/2007    Jean et al.
7,644,605 B2 *  1/2010    Kaito ........................ G01L 1/06
                                                            200/61.08

(Continued)

FOREIGN PATENT DOCUMENTS

CN    102353811 A    2/2012
WO    2006/127035 A2   11/2006

OTHER PUBLICATIONS

Yoon, S.W., et al., "Shock-Protection Improvement Using Integrated Novel Shock-Protection Technologies", Journal of Microelectromechanical Systems, vol. 20, No. 4, Aug. 2011, pp. 1016-1031 (16 pages).

(Continued)

*Primary Examiner* — Theresa T Doan
(74) *Attorney, Agent, or Firm* — Sughrue Mion, PLLC

(57) ABSTRACT

The invention relates to a damping system for a mobile mass (2) of a MEMS device (1), the system being capable of preventing direct contact between the mass (2) and a surface element (3) of the MEMS device (1), the damping system comprising: a mechanical bumper (4) positioned between the mass (2) and the surface element (3); a system (5) for locking/unlocking the bumper (4), which comprises one branch (51) oriented towards the bumper (4) having a blocking end (53) and a pin joint (54) capable of pivoting the (Continued)

branch (51), the locking/unlocking system (5) defining two subsequent positions of the mass (2).

12 Claims, 9 Drawing Sheets

(58) Field of Classification Search
USPC .......................................................... 257/415
See application file for complete search history.

(56) References Cited

U.S. PATENT DOCUMENTS

| 8,166,880 B2* | 5/2012 | Lafont ..................... F42C 15/26 |
| | | 102/231 |
| 2003/0018420 A1 | 1/2003 | Apanius et al. |

OTHER PUBLICATIONS

Xu, K., et al., "A Novel Shock Protection Method Based on Mems Compliant Latching Stopper", in Proc. IEEE MEMS 2016, Jan. 24-28, 2016, pp. 1125-1128 (4 pages).

International Search Report for PCT/FR2017/053166, dated Feb. 14, 2018.

* cited by examiner

DAMPING SYSTEM FOR A MOBILE MASS OF A MEMS DEVICE

CROSS REFERENCE TO RELATED APPLICATIONS

This Application is a National Stage of International Application No. PCT/FR2017/053166 filed Nov. 20, 2017, claiming priority based on French Patent Application No. 1661296 filed Nov. 21, 2016, the entire contents of each of which are herein incorporated by reference in their entireties.

TECHNICAL FIELD OF THE INVENTION AND PRIOR ART

The present invention relates to the design of mechanical systems with small-dimensioned movable elements, especially within MEMS (Micro Electro-Mechanical Systems) systems as small-sized inertial sensors.

One of the main causes of non-reliability and fragility of the MEMS devices is when said movable elements come into contact with fixed surfaces, during vibration events or a shock. This contact can on, the one hand, cause the bonding of the movable elements by electrostatic interaction or Van der Waals. On the other hand, these movable elements and the neighboring elements are likely to be deteriorated by violent and/or repeated shocks, for example during a sharp fall of the MEMS device.

These problems are all the more relevant when the elements in motion have significant mass or large displacement amplitudes: in both cases, the kinetic energy of the movable body is increased when the mass is put into displacement, and the risk of deterioration of the movable system during an impact with an opposite fixed surface is increased. This is particularly the case within advanced inertial systems, such as accelerometers or gyroscopes, such systems necessarily including masses of high inertia and large displacement amplitude to reduce the signal/noise ratio.

In order to limit the risks of bonding, it is known in the art to implement rigid stop elements on the surface of a MEMS sensor movable body, so as to reduce the surface of the contact area between the movable body and a fixed support located on its trajectory. Indeed, the intensity of the interactions at the source of the bonding is proportional to said contact surface. However, the smaller this surface, the more the mechanical constraints are concentrated thereon, with a risk of increased mechanical failure at the stop.

It has been proposed to introduce into MEMS sensors, flexible and deformable elastic or plastic stoppers instead of rigid and non-deformable stop elements, for the purpose of no longer abruptly stopping the stroke of the movable body against a fixed support, but of damping the stroke of the movable body, to slow down and then stop its displacement. The following publication: S. W. Yoon, S. Lee, N. C. Perkins, and K. Najafi, *Shock-Protection Improvement Using Integrated Novel Shock-Protection Technologies*, Journal of Micro-electromechanical Systems, Vol. 20, no. 4, pp. 1016-1031, August 2011, proposes stops with elastic or plastic behavior to reduce the force of the impact of beams on hard surfaces within MEMS systems.

However, the design of stop elements of plastic nature induces additional complexity in the method for manufacturing the mechanical parts. Moreover, a movable element in motion coming into contact with a stopper with purely elastic behavior has its kinetic energy converted mostly into potential energy of the stopper. When the kinetic energy of the movable body reaches zero, a very elastic stopper can restore much of its potential energy into kinetic energy of the movable body, with low energy dissipation. The stopper is thus likely to put again the movable body in motion, and can cause multiple rebounds of the movable structure on neighboring surfaces with the risks of mechanical disruption.

To overcome this problem, it has been proposed to lock such an elastic stopper in its position displaced by the movable body, while it has stored part of the kinetic energy of the movable body in the form of potential energy, so that this potential energy is not returned to the movable body. The reader will be able to refer to the following publication: K. Xu, N. Zhu, X. Zhang, W. Su, W. Zhang, and Y. Hao, *A novel shock protection method based on MEMS compliant latching stopper*, in Proc. IEEE MEMS 2016, 2016, pp. 1125-1128. The elastic stopper implemented here comprises a pair of hooks on a portion projecting from the surface of the stopper, which can mate with hooks mounted on a wall facing the stopper. When the mass, directed towards the wall, comes into contact with the stopper, the latter is deformed and then mechanically locked by the hooks in its deformed position, once it has reached critical deformation amplitude. Thus, when the movable body returns to its initial position, the stopper is blocked and is not able to communicate its elastic potential energy to the movable body. The stopper cannot be released in the vicinity of the movable body and cause rebounds.

This solution, as well as other similar solutions known from the state of the art, have however the serious disadvantage of not being usable more than once, the blocking of the stopper being designed to be irreversible. To the occurrence of a new event of shock or vibration of the mechanical structure, the stopper system, remained in the blocked position, no longer assures its function of absorbing the mechanical shocks, and may even aggravate the effect. When the stopper is in the blocked position, the free excursion amplitude of the movable body is increased and its kinetic impact energy can be increased.

The international patent application WO 2006/127035 A2 discloses a shock sensor that can be implemented in a MEMS device, comprising a mass movable in translation. This mass is provided with a hook engageable with a ratchet, to hold the mass in the locked position after a shock event and detect a certain level of shock. This document provides an additional element for unblocking the mass, in the form of an unlocking actuator that can act on the ratchet. The shock sensor is therefore reusable to detect a succession of shock events. However, no function of absorbing the shock between the movable body and the opposite element is here ensured. The complexity and bulk of the device implemented in this document make difficult its association with elements absorbing the shock experienced by the movable body. In addition, the restart actuator described therein is controlled by active, for example thermal or capacitive, control and this document does not propose a purely mechanical solution in a passive control mode.

There is therefore a need for a solution for locking an elastic stopper in an electromechanical microstructure which also provides a step of unlocking the stopper, by passive or active control, without inducing excessive complexity in the design.

GENERAL DESCRIPTION OF THE INVENTION

The present invention proposes, by a mechanical design adapted to small-dimensioned systems and a clever dimensioning of the mechanical elements, a system for controlling the locking/unlocking of an elastic stopper for a micromechanical structure that can operate on a passive control mode as active, of relevant use in a MEMS-type device.

A stopper according to the invention provides, in combination with a locking/unlocking system according to the invention, a mechanical hysteresis cycle, the stopper having a non-linear mechanical behavior with respect to the displacement amplitude of the movable mass it damps. However, the irreversibility introduced by the blocking of the stopper in a locked position after a first shock event is addressed by a subsequent unlocking step which can be actively or passively controlled, as will be described hereinafter.

According to a first aspect, the invention relates to a damping system for a movable mass of such a device, the system being able to prevent direct contact between the mass and a surface element of the MEMS device, the mass being movable in translation relative to the surface element along a first direction, the damping system comprising:

a mechanical stopper with elastic properties, positioned between the mass and the surface element, said stopper being oriented along a second direction when it is in a rest position, associated with a locking/unlocking system with the following elements:

a branch oriented towards the stopper terminated by a blocking end, a pivot link capable of pivoting the branch along an axis of rotation perpendicular to the plane of the plate on which the elements of the MEMS device are arranged, the locking/unlocking system defining two positions of the mass along its direction of translation:

a central position, a first end position where the mass is brought closer to the opposite surface element with respect to its central position, the stopper then being pressed towards the surface element along a locked position, the branch being configured to block the stopper in this locked position by the blocking end, the unlocking system being further configured to enable a rotation of the locking/unlocking system about the pivot link, up to a position where the stopper is not held in the locked position.

In one embodiment corresponding to a passive mechanical control of the locking/unlocking system, illustrated in FIGS. 1 to 9, there is provided here a locking/unlocking system further comprising a lever secured to the branch and rotary along the same pivot link as the branch, the damping system further comprising a protrusion element secured to the mass, extending out of the mass towards this lever, so that when the mass switches from the central position to a second end position, the lever is driven by the translational movement of the protruding element and rotates the locking/unlocking system about the pivot link up to a position where the stopper is not held in the locked position.

In a second embodiment corresponding to an active control of the locking and unlocking of the stopper, not illustrated here, the control of a rotation operation of the locking/unlocking system about its pivot link can be ensured by an actuator, associated for example with an actuator of a surface opposite the MEMS device. These actuators may for example be electrically activated electrostatic comb drives to modulate the distance between the locking/unlocking system and an opposite surface, generating an electrostatic interaction force sufficient to rotate the locking/unlocking system in one orientation or the other about its pivot link.

According to a second aspect, the invention proposes a MEMS device, of the sensor or actuator type, comprising a damping system according to the first aspect of the invention. The invention is of advantageous use for a MEMS device in which a mass is movable relative to the neighboring elements, and incurs significant risks of mechanical bonding or mechanical disruption during an event of shock with said elements.

MEMS devices are furthermore proposed including several locking/unlocking systems, in order to damp a movable mass either in several orientations of displacement along the same direction of translation (as illustrated in FIGS. 4 to 7), or in several directions of translation (case illustrated in FIG. 8).

In a non-limiting and very advantageous manner, such a plurality of locking/unlocking systems may be associated with one or more coupling system(s) in order to link the rotational movements of the locking/unlocking systems in response to the displacement of the movable mass, in order to improve the passive control of the step of unlocking the plurality of stoppers, and to improve the reversibility of the step of locking the stopper. Clever dimensioning of the elements of the invention allows this synergy between a plurality of locking/unlocking systems, as will be described below, in particular with reference to FIGS. 4 to 7.

The invention furthermore proposes a MEMS device including a damping system provided to operate with a set of two masses able to move relative to the neighboring surface elements along two directions, said two masses being or not being able to be part of the same movable element. Four sets of stoppers and locking/unlocking systems are then made, the four systems being coupled as will be described hereinafter with reference to FIG. 9.

The present invention, several exemplary embodiments of which are illustrated by the following figures and detailed below, gives a solution simple to manufacture and to introduce within a MEMS device for ensuring the locking and unlocking by passive or active control of a stopper with elastic behavior. The very simple design of the locking/unlocking system proposed here makes its implementation in a small-dimensioned MEMS device possible, with the aim of miniaturization of such a device.

The small bulk generated by the locking/unlocking system makes it possible to implement several of these systems to damp a movable body within a MEMS device in several directions of translation, as explained below. The present invention makes possible a simultaneous active control of several locking/unlocking systems.

The present invention also proposes a set of damping systems as defined above, for a mass of a movable MEMS device capable of coming into contact with several surface elements of the neighboring structure of the MEMS device along one or more direction(s) of displacement in translation.

Furthermore, the present invention also proposes a system for coupling several locking/unlocking systems, using pivots and slides. This latter solution facilitates the simultaneous active control of several locking/unlocking systems. In addition, the use of two coupled locking/unlocking systems improves the potential for reuse of a stopper during new events of mechanical shock, as will be explained below.

It should be understood by those skilled in the art that the scope of use of the present invention is not limited to the case of movable bodies describing only a trajectory in translation within a MEMS device. The invention can be advantageously used in combination with movable bodies whose general movement comprises rotary components but can be locally described mostly as a translational movement.

GENERAL PRESENTATION OF THE FIGURES

Other characteristics, objects and advantages of the present invention will become more apparent upon reading the following detailed description describing several advantageous embodiments within MEMS systems, as well as with reference to the following figures which should be interpreted for purely illustrative and non-limiting purposes.

FIG. 1 schematically represents a first case where a mass is damped along one direction of translation only in one orientation, the mass being represented in an initial central position.

Figure 4:
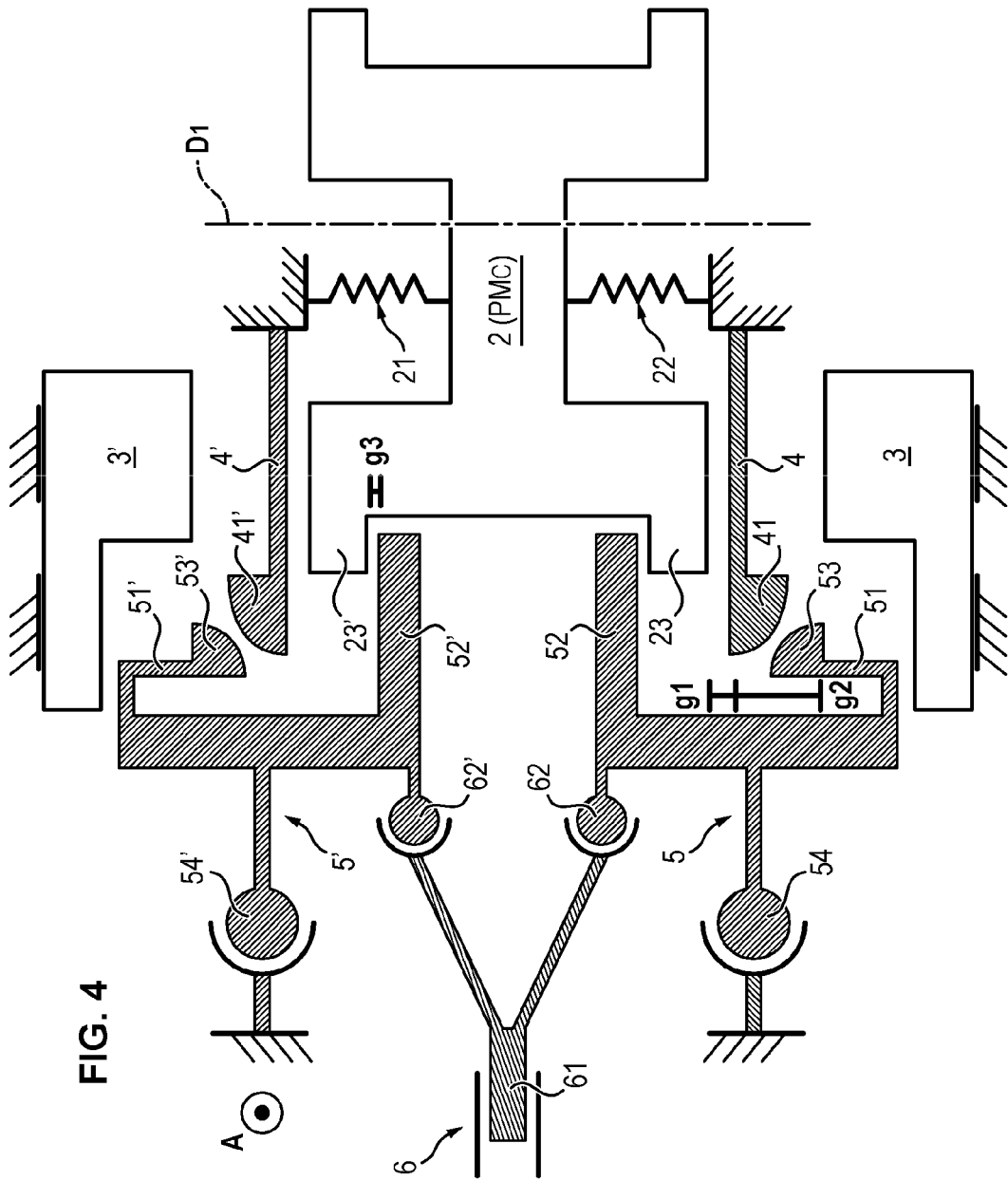

FIG. 4 schematically represents a second case, where two coupled locking/unlocking devices are placed on either side of a direction of translation of a movable mass, here represented in the initial central position.

Figure 5:
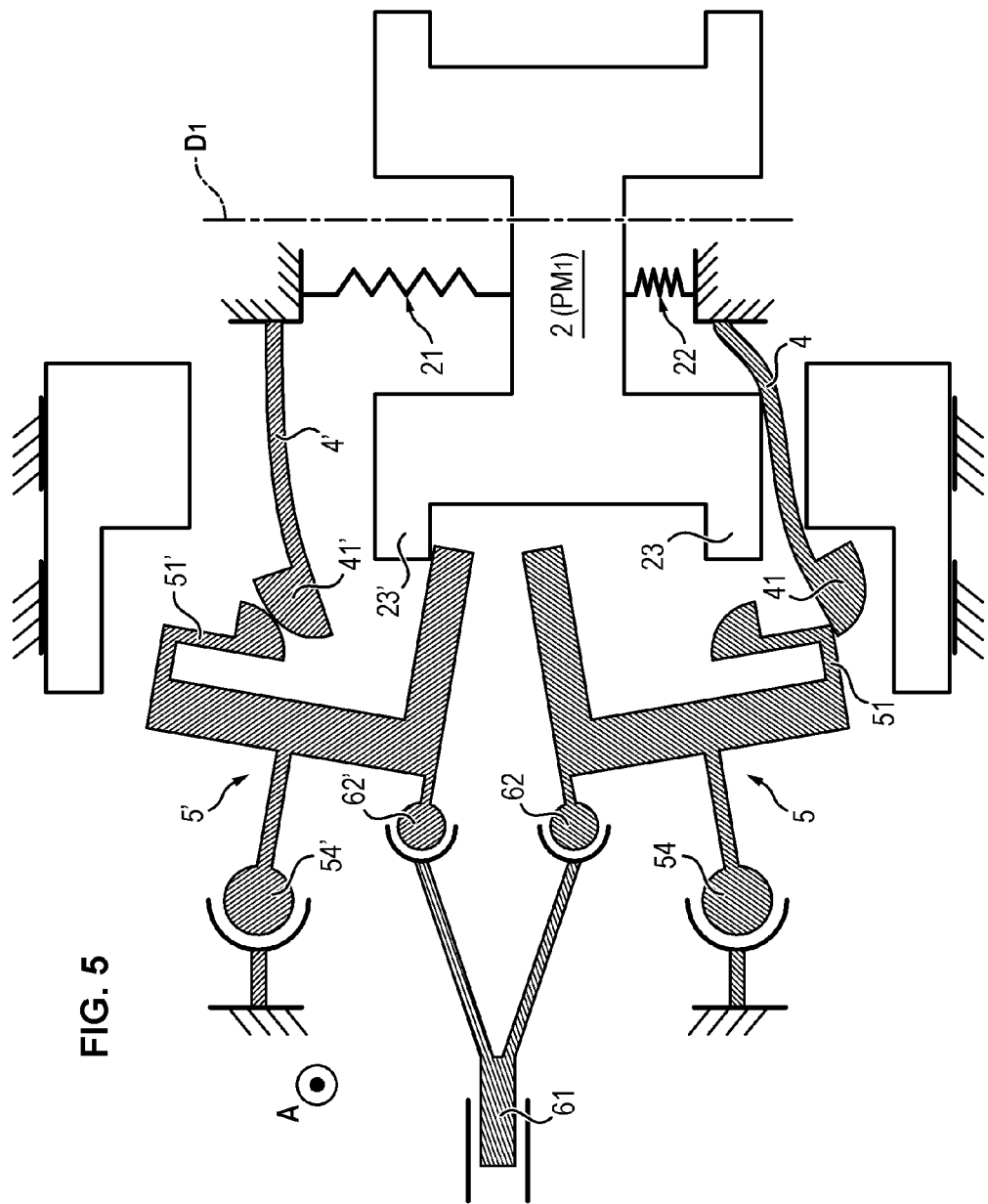

FIG. 5 illustrates the same device with two coupled locking systems, when the mass switches into the low position from the state of the system presented in FIG. 4, its contact with the opposite frame element being damped by the low stopper.

Figure 6:
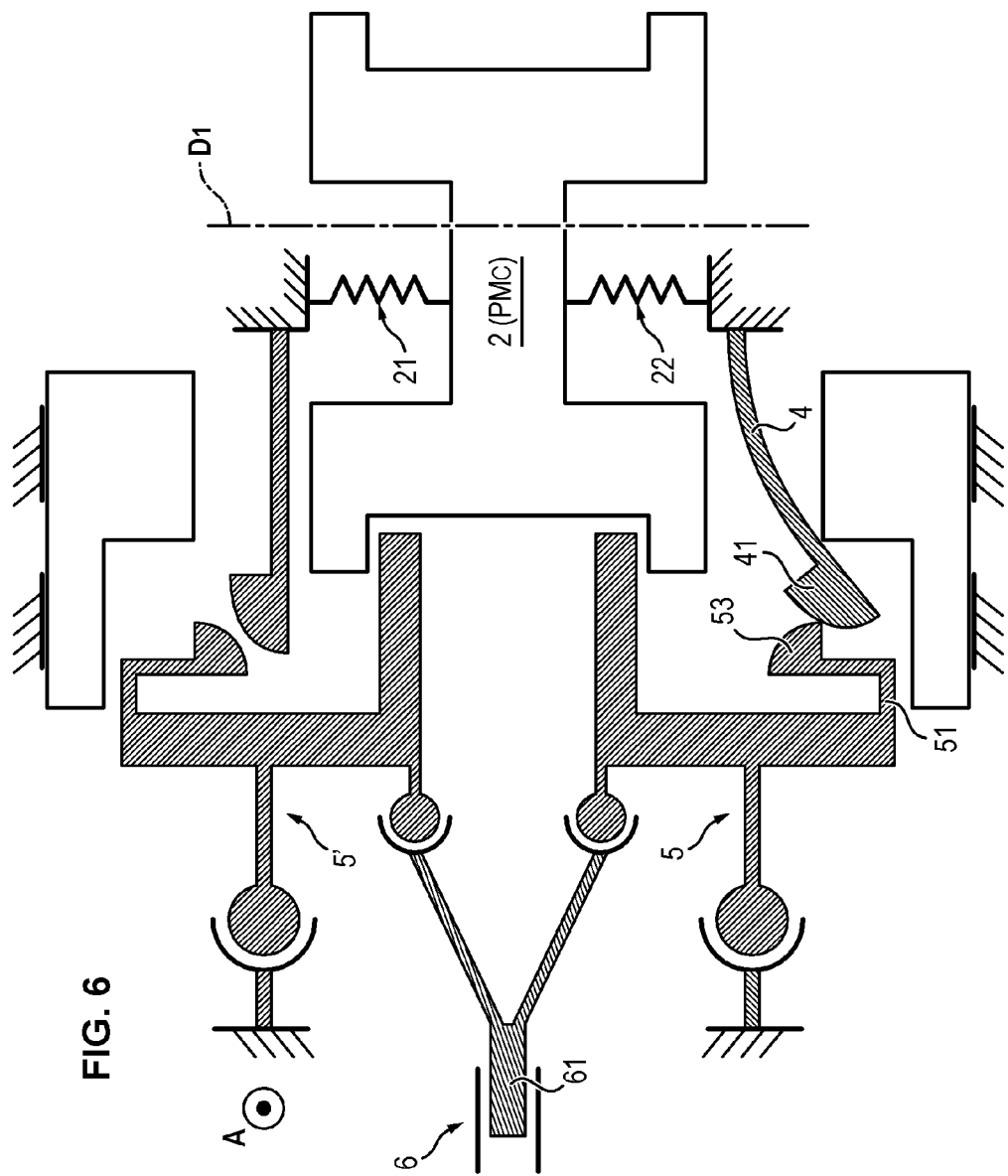

FIG. 6 illustrates, within the same device, the return of the mass into the central position after the step presented in FIG. 5, the low stopper remaining blocked in the low locked position.

Figure 7:
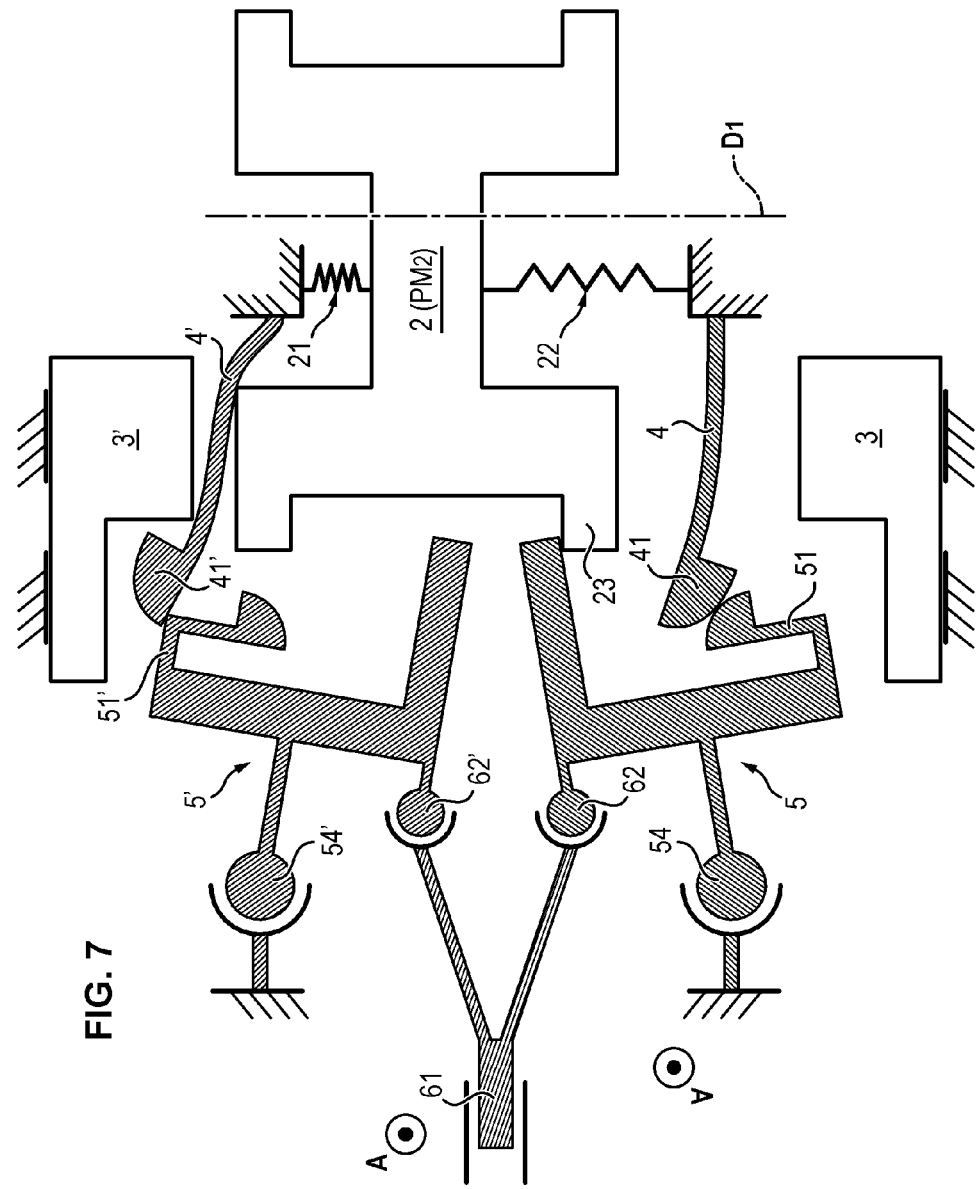

FIG. 7 illustrates, from the state of the system presented in FIG. 6, a switching of the mass into the top end position.

Figure 8:
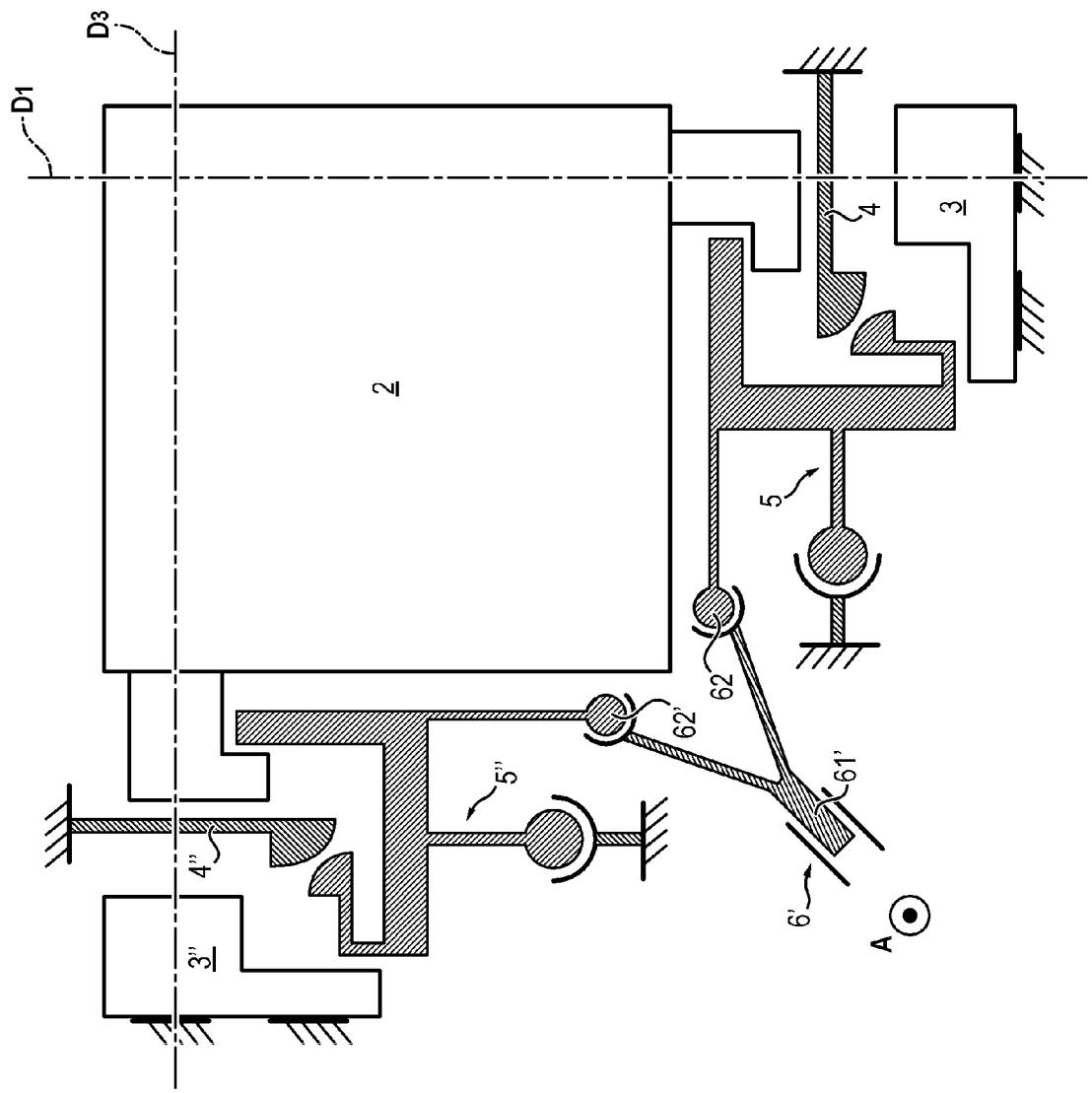

FIG. 8 schematically represents a third case, where a mass is movable along two substantially perpendicular directions of translation and damped in only one orientation along these two directions.

Figure 9:
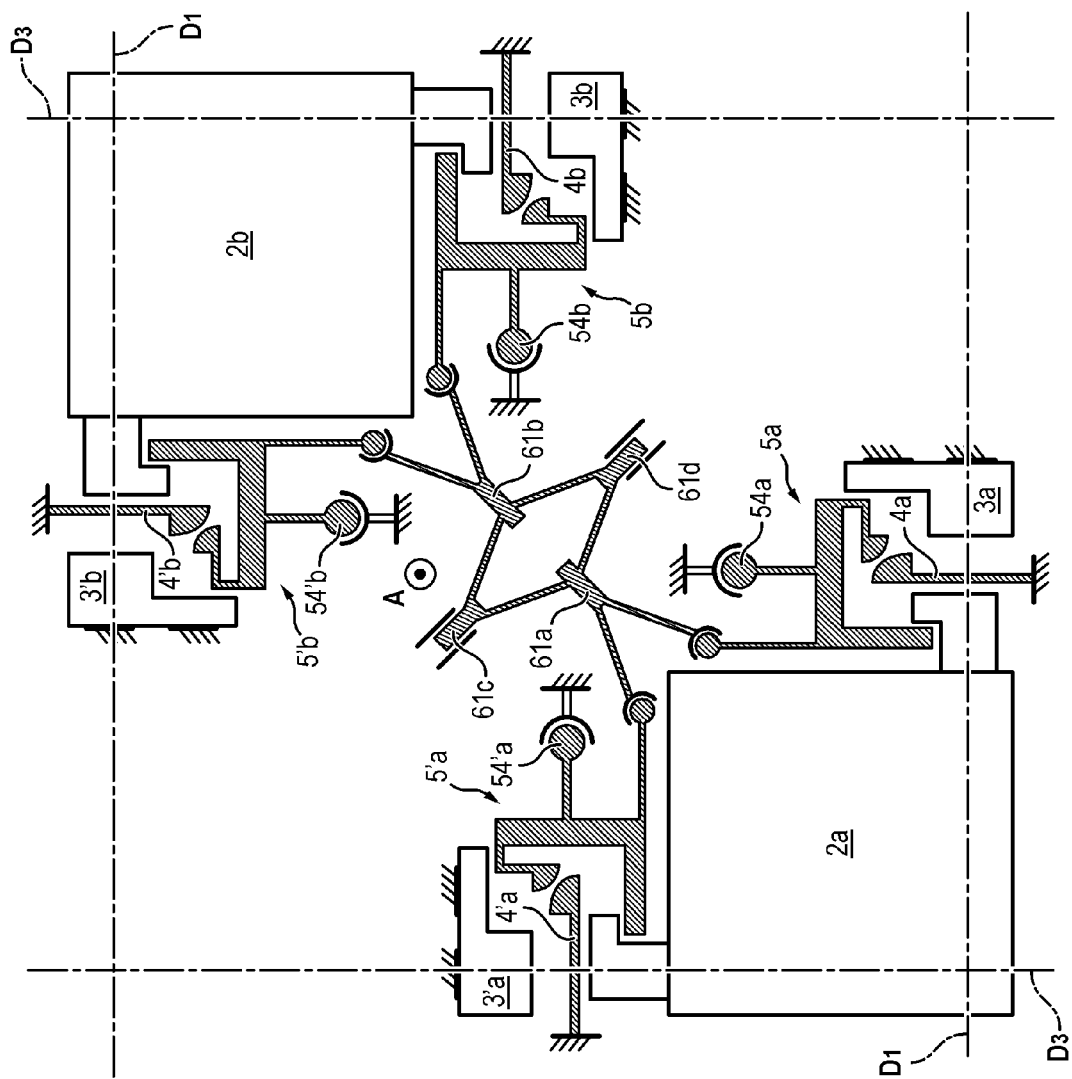

FIG. 9 schematically represents a fourth case, where two masses are movable along the same two substantially perpendicular directions of translation, and damped in only one orientation along these two directions.

DETAILED DESCRIPTION OF PARTICULAR EMBODIMENTS

All of the embodiments described here concern a MEMS-type electromechanical device comprising a small-dimensioned mass, which can move relative to neighboring surface elements likely to block its stroke, in a movement that can be locally described as a translational movement. It is recalled that this local translational movement can be part of an overall movement of the mass including other translational components or rotational components or deformation constraints.

Figure 1:
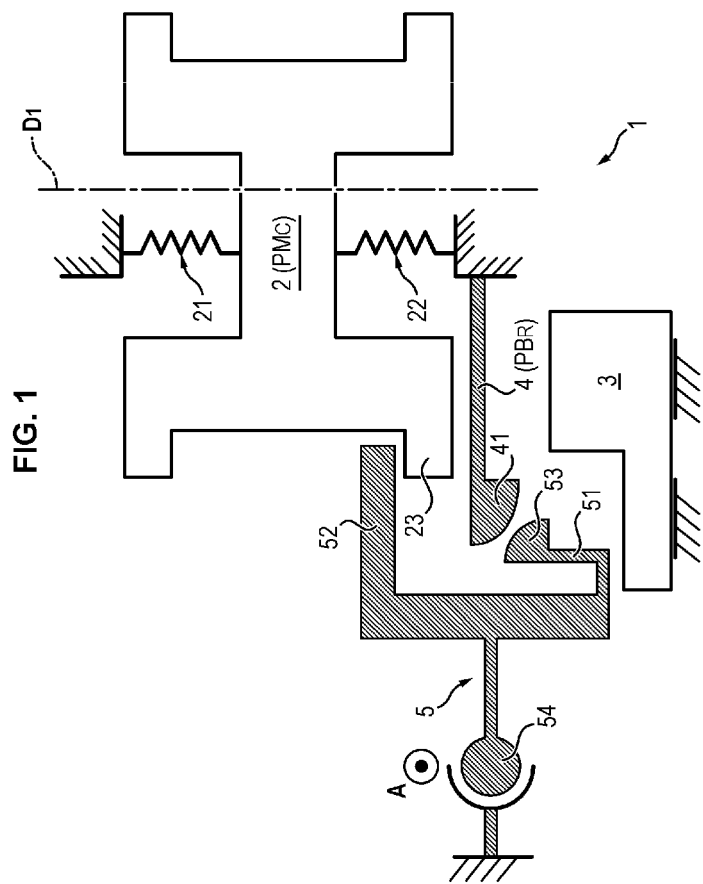

FIG. 1 represents a movable mass 2 of a MEMS-type device, movable in translation along a substantially vertical direction relative to a surface element 3 of the MEMS device. The damping system represented here is intended to damp the movement of the mass 2 downwards, when the latter is driven in an acceleration large enough to bring it into contact with a stopper 4. It is understood that it is possible to damp a translational movement of a mass along any direction of the space.

According to one non-essential characteristic, the mass 2 is here constrained in translation by two return elements 21 and 22. Here, return element 21 and return element 22 are springs. The spring 21 is fixed by one end to an upper face of the mass 2, and by another end to a surface element fixed relative to the surface element 3. Similarly, the spring 22 is fixed at one end to a lower face of the mass 2, and at another end to a fixed element. Here, the two springs tend to return the mass 2 into a central position $PM_C$, as illustrated in FIG. 1. It is understood that the mass 2 could be constrained in translation by any other means usable in a MEMS device. The central position $PM_C$ represented here can be considered as a rest position of the mass.

The stopper 4 comprises a leaf spring with elastic behavior extending substantially on a plane perpendicular to the plane of the figure (therefore horizontally), of thin thickness along the vertical direction, and a tip element 41 of greater thickness along the vertical direction. In its rest position $PB_R$ presented here, that is to say a position where the stopper 4 is not elastically constrained, the stopper 4 extends substantially on a plane perpendicular to that of the figure. The stopper 4 is here simply embedded through its right end in a fixed surface element relative to the element 3, the left end being vertically movable. It is vertically embedded through a level that allows it to extend between the mass in the central position and the surface element 3. According to another embodiment not represented in the present application, the stopper 4 could be double embedded, for example embedded on the one hand at its right end on the plane represented in FIG. 1, and on the other hand at a left end on another plane parallel to the plane of the figure. The stopper 4 is thus disposed to be interposed between the mass 2 and the element 3 if the mass 2 is directed in translation against the element 3. The stopper 4 is manufactured in a material having elastic properties and good mechanical strength, such as silicon, silica, germanium, silicon nitride, or another semiconductor material conventionally used in MEMS devices.

A locking/unlocking system 5 is further represented. In the embodiment exposed here, and in a non-limiting manner, the locking/unlocking system 5 carries out a passive control of the stopper position 4, according to modalities explained subsequently. The system 5 is formed in a rigid material having good mechanical strength. It comprises on its low portion a branch 51 in several portions: a portion extending along a horizontal direction towards the stopper 4, and a portion extending vertically and ending with a hook 53, so as to present a concavity generally oriented toward the right and extend over the deformation path of the stopper 4, so that an element which would extend horizontally under the hook 53 would be limited in its upward movement by the hook 53. The locking/unlocking system 5 further comprises, on its upper portion, a lever 52, securely connected to the branch 51, which extends horizontally towards the mass 2. The branch 51 and the lever 52 form a rigid assembly, connected by a pivot link 54 to a surface element fixed relative to the element 3, so that the locking/unlocking system 5 is partially free in rotation about an axis substantially perpendicular to the plane of the figure.

Finally, the mass 2 includes, on its left low portion opposite the lever 52, a protrusion element 23 directed towards the lever 52, rigid and secured to the mass 2 in its vertical translational movement. The lever 52 and the branch 51 are dimensioned and arranged in such a way that in the central position of the mass 2 represented here, the protrusion element 23 is disposed between the lever 52 and the stopper 4 at rest, the hook 53 being located under the stopper 4 at rest.

It should be noted that the lever 52 and the protrusion element 23 are useful within the damping system only according to the embodiment ensuring a passive control of the locking/unlocking system, as it is the case here. According to another embodiment not represented by a figure in the present application, additional elements mentioned below can ensure the same function as the protrusion element 23 and the lever 52 via an active control.

Figure 2:
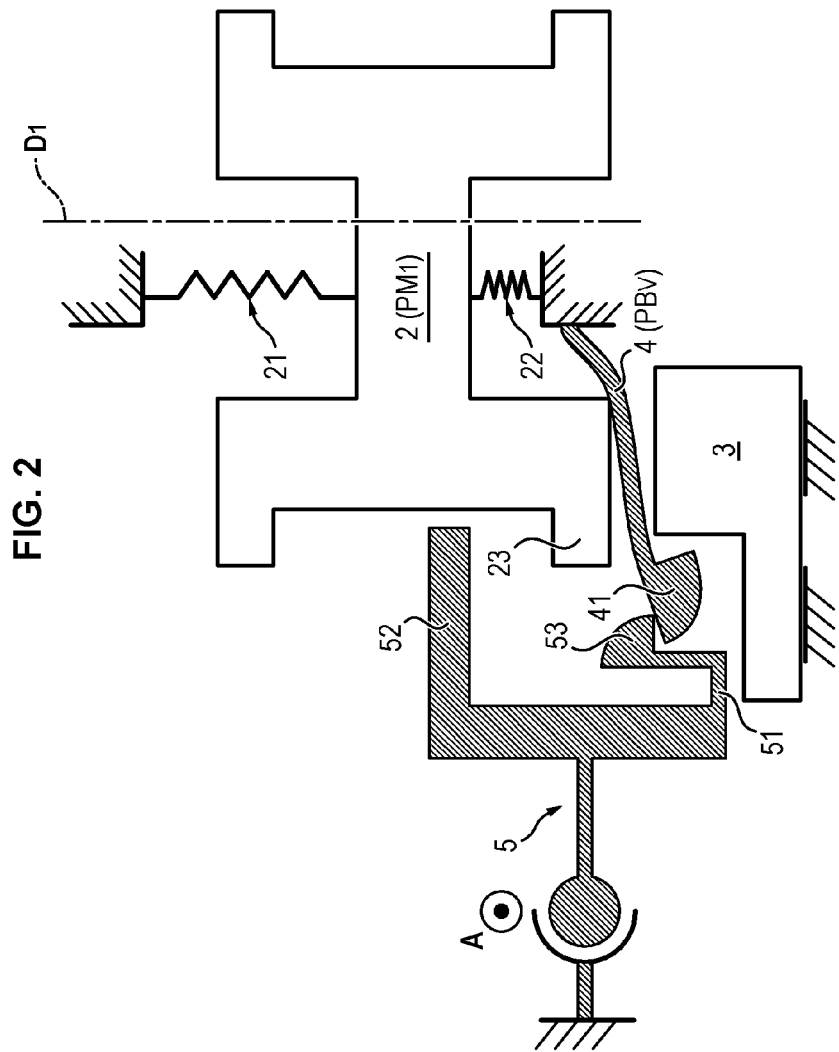
FIG. 2 illustrates the same device, the movable mass being in a first low end position, the stopper being set in the locked position.

FIG. 2, where the reference numbers of FIG. 1 are preserved for the corresponding elements (as well as for all the other figures), represents the mass 2 in a low translated position $PM_1$, taken as a first end position of the system, the low spring 22 working in compression and the spring 21 working in relaxation. The position $PM_1$ is sufficiently translated relative to the central position $PM_C$ so that the stopper 4, driven by the stroke of the mass 2 downwards, is switched into a locked position $PB_V$. In this locked position, the stopper 4 no longer extends in its entirety on a plane substantially perpendicular to the vertical plane, but is displaced downwards while remaining embedded through its non-movable right end. Thus, the movable end 41 of the stopper 4 has passed under the hook 53 of the opposite branch 51, and the protrusion element 23 has moved away from the lever 52 relative to the central position $PM_C$ of the mass 2. During the movement of the mass 2 from the position $PM_C$ to the position $PM_1$, the kinetic energy of the mass 2, related to its speed in translation, is partially converted into elastic potential energy of the leaf spring of the stopper 4, of stiffness $k_b$, and is partially converted into elastic potential energy of the springs 21 and 22 constrained into a position which is not their rest position, of stiffness k. During a rise of the mass 2 upwards, without exceeding a state of the mass 2 where the protrusion element 23 abuts against the lever 52, the stopper 4 remains blocked under the hook 53 (this state of rise of the mass 2 upwards is not represented here). Thus, the elastic potential energy stored by the stopper 4 is not returned in the form of kinetic energy to the mass 2, and only the potential energy stored by the springs 21 and 22 is likely to be returned. With η referring to the energy efficiency seen for the mass 2 during above-mentioned steps of descent, then of rise of the mass 2, with x (not represented) referring to the maximum vertical displacement amplitude of the mass 2 with respect to the central position PMC and with $g_b$ referring the vertical distance (not represented) between the low edge of the mass 2 and the upper surface of the stopper 4, we can have $$\eta = \frac{E_{spring}}{E_{spring} + E_{stopper}} = \frac{kx^2}{kx^2 + k_b(x - g_b)^2}$$

Due to the blocking of the stopper 4, there is an efficiency η strictly less than 1. The kinetic energy of the mass 2 in its downward movement is not entirely returned thereto, with the advantage that the mass 2 is not likely to rebound vertically at the release of the stopper 4 during a rise of the mass 2, between the surface element 3 and an opposite surface element, not represented here. An energy efficiency η less than 95% can already be considered as significant to avoid this rebound effect, the system presented here theoretically allowing to return to an efficiency as low as 50%.

Figure 3:
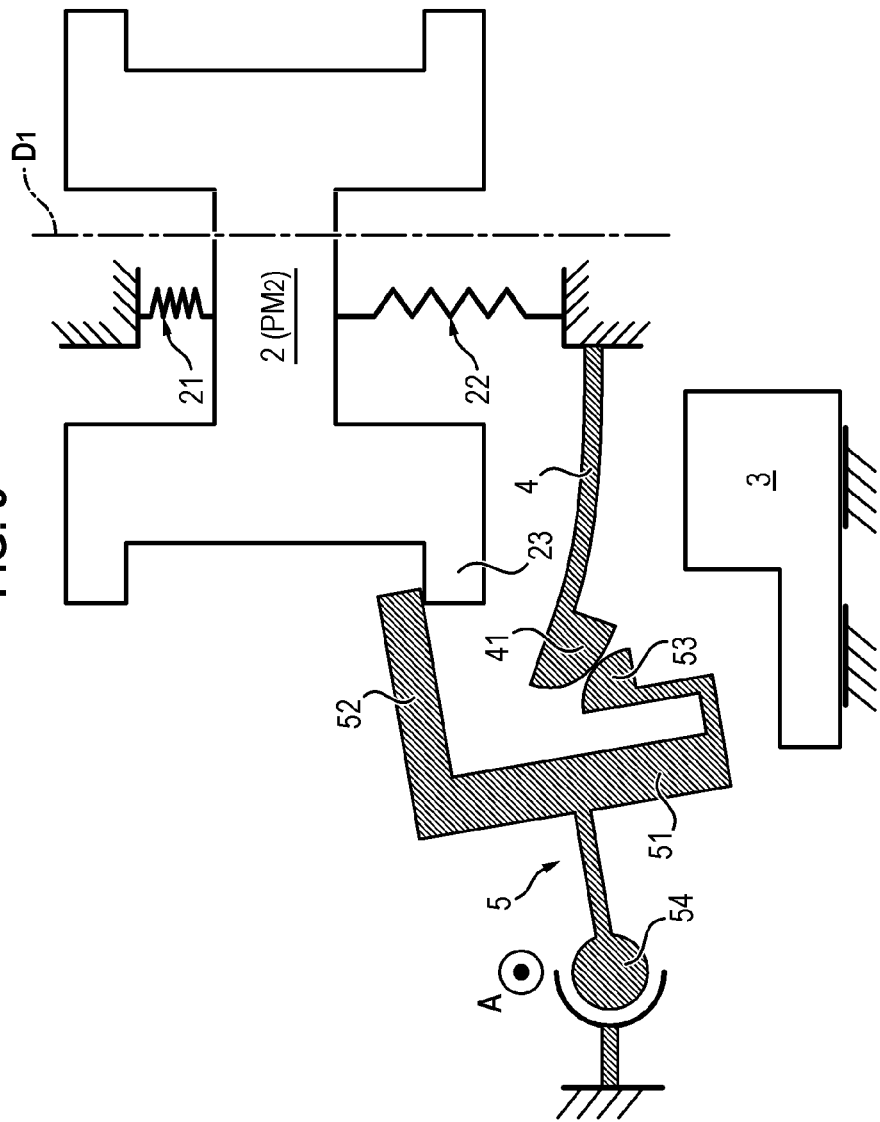
FIG. 3 illustrates the unlocking phase of the stopper when the mass switches into a second top end position.

FIG. 3 illustrates, for the same device, the rise of the mass 2 towards a high position taken as the second end position $PM_2$. The position $PM_2$ is sufficiently high so that, in its stroke from its central position $PM_C$ to its high position $PM_2$, the mass 2 drives via the protrusion element 23 the lever 52, which, due to its non-deformability, drives in rotation upwards the locking/unlocking system 5 via the pivot link 54. The branch 51 and in particular the hook 53, secured to the lever 52, are driven in rotation upwards, up to a position where the hook 53 is sufficiently lifted so that the end 41 of the stopper 4 is no longer blocked in the locked position $PB_V$. The stopper 4 is thus released and dissipates its elastic potential energy stored during the step of descent of the mass 2 illustrated in FIG. 2. Advantageously, this energy is not returned to the mass 2 and is therefore not likely to cause rebounds of the mass 2.

In this embodiment, where there is passive control of the unlocking of the locking/unlocking system 5, the unlocking of the stopper 4 after switching into the locked position $PB_V$ can be obtained only if the mass 2 rises sufficiently in a subsequent step so that the protrusion element 23 drives the lever 52 upwards, for example in the high position $PM_2$. If, after the first low end position $PM_1$, the mass 2 rises towards a position that does not fulfill this condition, for example towards the central position $PM_C$ towards which it is spontaneously constrained by the return means 21 and 22, the stopper 4 is not unblocked and its effectiveness for absorbing a subsequent shock of the mass 2 downwards is compromised.

In another embodiment where there would be active control of the unlocking of the locking/unlocking system 5, not represented in the present application, electronic actuation means may be disposed on the locking/unlocking system 5, for example on the lever 52, and on an opposite surface, to allow the conversion of an input electrical signal into a mechanical action of rotation of the branch 51 upwards about the pivot 54. For example, electrodes of a different polarity placed on the one hand on a high portion of the lever 52, on the other hand on an opposite fixed surface, can form a suitable electrostatic actuator. In this active control mode, the protrusion element 23 is no longer essential to the unlocking and can be omitted. Moreover, the unlocking is then a priori no longer conditioned by the rise of the mass 2 to a particular high position, and it is advantageously possible to establish an unlocking threshold of the stopper 4 at a position of the mass 2 lower than the high position $PM_2$.

A second embodiment of a set of damping systems is represented in FIGS. 4 to 8. In this embodiment, the mass 2, movable in translation along a substantially vertical direction, is damped not only in its downward movement as in the previous embodiment, but also in its upward movement relative to a second surface element 3' of a MEMS device, by a second locking/unlocking system 5' associated with a second elastic stopper 4'. The structure and the arrangement of the second locking/unlocking system 5' and of the stopper 4' follow in all points, symmetrically with respect to a plane perpendicular to the plane of FIG. 4, those of the locking/unlocking system 5 and of the stopper 4. It should however be noted that the dimensioning and the arrangement of the elements corresponding to the damping of the movement of the mass 2 upwards could also be different, if the structure of the MEMS device requires it, as long as the functionality of the locking/unlocking system 5' according to the modalities described above is preserved.

It should be noted that in the case represented in FIGS. 4 to 8, the two locking/unlocking systems 5 and 5' and the two elastic stoppers 4 and 4' damp the displacement of the mass 2 on one and the same vertical axis of translation, the two stoppers 4 and 4' being disposed on either side of the mass 2 in its direction of displacement. However, it is also possible to damp, by two locking/unlocking systems, translational movements along two distinct directions, as explained below and illustrated in particular in FIG. 8.

The device represented in FIG. 4 comprises, as such, in addition to the elements already identified in the preceding figures, the following elements: surface element 3', stopper 4' also embedded on its right end, having its left end 41' free, locking/unlocking system 5' comprising a branch 51' provided with an end hook 53' and a lever 52', in rotation about a pivot link 54', the lever 52' being able to interact with a protrusion element 23' rigid and secured to the mass 2 in its movement.

The operation of these various elements taken in combination will not be detailed again here. Nonetheless, to use the vocabulary and the terms described above, it should be noted that a first low end position $PM_1$ of the mass 2 for the stopper 4, as defined above, corresponds to a second end position of the mass 2 for the stopper 4', and a second top end position $PM_2$ of the mass 2 for the stopper 4 corresponds to a first end position of the mass 2 for the stopper 4'.

A sequence of successive steps of vertical positioning of the mass 2 is detailed below.

According to an alternative embodiment not represented here, a functional damping system for both high and low directions of translation does not comprise additional coupling elements between the two locking/unlocking systems 5 and 5'.

According to another very advantageous embodiment represented in FIG. 4 and the following figures, the set of damping systems further comprises a coupling system 6 between the two locking/unlocking systems 5 and 5'. The coupling system 6 is connected to the two locking/unlocking systems 5 and 5' respectively by the pivot link 62, located on a high portion of the locking/unlocking system 5, for example in the continuity of the lever 52, and by the pivot link 62', located on a low portion of the locking/unlocking system 5', for example in the continuity of the lever 52'. The coupling system 6 also comprises a slide 61, connected to the two pivot links 62 and 62'. The degrees of freedom of the coupling system 6 are constrained by the slide 61, so as to allow only the translation of the slide 61 along a substantially horizontal axis. In this manner, a rotational movement of the locking/unlocking system 5 about its pivot link 54, in particular an upward rotational movement, causes a rotational movement of the same angle in the opposite orientation of the locking/unlocking system 5' about its pivot link 54' in the opposite orientation, and vice versa. Advantages of this configuration will be exposed below and explained by the following figures.

FIG. 5 represents the same device, when the mass 2 reaches a first low end position $PM_1$ for the stopper 4. FIG. 5 thus corresponds to the same step as FIG. 2 for the stopper 4 and the locking/unlocking system 5. The behavior of these elements is equivalent to the behavior already described above with reference to FIG. 2, except that the locking/unlocking system 5, constrained on its pivot link 62, has rotated upwards about its pivot link 54. The branch 51 is thus turned upwards, but the stopper 4 remains in the low position, constrained by the mass 2 which abuts against the surface element 3.

This rotation of the locking/unlocking system 5 is caused by a translation of the slide 61, itself caused by a downward rotation of the locking/unlocking system 5' about its pivot connection 54'. Indeed, in its stroke towards its low end position $PM_1$, the mass 2, via the protrusion element 23', has driven downwards the lever 54'. Everything happens for the locking/unlocking system 5' and the stopper 4' just like the situation presented in FIG. 3 for the locking/unlocking system 5 and the stopper 4. The stopper 4', which was in the state presented in FIG. 4 in a substantially horizontal rest position, is driven downwards by the stroke of the branch 51', but this has no effect at this stage of the displacement of the mass 2.

Distances $g_1$ and $g_2$ are represented, for the sake of clarity, in FIG. 4. The upper surface of the stopper 4 and the protrusion element 23 are at the distance $g_1$. The upper surface of the stopper 4 and the surface element 3 are at the distance $g_2$. An amplitude $g_1+g_2$ of downward movement of the mass 2 then allows the locking of the stopper 4 in the locked position $PB_V$.

FIG. 6 represents, again for the same system, the return of the mass 2 to its central position $PM_C$ after passing through the states illustrated in FIGS. 4 and 5. The system has returned to a state similar to that illustrated in FIG. 4, except that the stopper 4 is blocked in its locked position $PB_V$, by its free left end 41 which is blocked under the hook 53.

From FIG. 6, the figures of the present application illustrate a switching to two possible states.

In FIG. 7, the mass 2 is mounted towards a second top end position $PM_2$ for the stopper 4. FIG. 7 thus corresponds to the same step as FIG. 3 for the stopper 4 and the locking/unlocking system 5. The behavior of these elements is equivalent to the behavior already described above by referring to FIG. 3. The stopper 4 is released from its locked position $PB_V$, and is able to damp the mass 2 if it is moved downwards again.

Furthermore, the switching of the mass 2 into its top end position $PM_2$ causes the switching of the second stopper 4' into the locked position, with the mass 2 pressing the stopper 4' against the surface element 3'. Due to the coupling of the pivot links 62 and 62', the locking/unlocking system 5' is driven downwards by the upward stroke of the locking/unlocking system 5 set in the unlocked position, but this has no advantageous effect on the stopper 4'.

However, when the system is switched from the state presented in FIG. 6 to a new state similar to that presented in FIG. 5, where the mass 2 returns into the low position $PM_1$ a second time after having switched again a second time into the central position $PM_C$, the stopper 4 is released from its locked position $PB_V$ before the mass 2 ends up its stroke downwards and presses the stopper 4 against the surface element 3.

This unlocking of the stopper 4, during another switching of the mass 2 into the low position $PM_1$ after a state where the stopper 4 is in the locked position $PB_V$, constitutes a major advantage of the embodiment represented here comprising coupling system 6.

This is allowed by the dimensioning of the set of damping systems, which provides that the lever 52' is driven by the protrusion element 23' in the downward stroke of the mass 2, causing the lifting of the branch 51, before the mass 2 reaches a position where the stopper 4 is no longer able to leave its locked position $PB_V$.

The dimensioning constraints on the assembly to allow this sequencing of steps are, for the sake of clarity, illustrated by the distances $g_1$ and $g_3$ seen in FIG. 4. As a reminder, the upper surface of the stopper 4 and the protrusion element 23 are at the distance $g_1$. Furthermore, the upper surface of the lever 52' and the protrusion element 23' are at the vertical distance $g_3$. The unlocking of the stopper 4 before its blocking by the mass 2 is allowed by the fact that the distance $g_1$ is strictly greater than the distance $g_3$.

A set of damping systems including a solution for coupling two locking/unlocking systems, therefore allows an improved reversibility of the locking of the elastic stoppers. After a movement of the mass 2 in a given orientation causing the locking of a stopper, it only takes, for example, a return of the mass 2 to its central position to unlock any one of the two stoppers 4 and 4', while in the absence of a coupling system, a switching of the mass 2 to an end position in the other orientation far beyond its central position would have been necessary for the unlocking.

A third embodiment of a set of damping systems is presented in FIG. 8, which partially uses the references given in FIGS. 4 to 8 to designate elements of the same function. Here, a coupling system 6' is implemented between two locking/unlocking systems 5 and 5", which respectively aim at absorbing possible shocks of the mass 2 against two surface elements 3 and 3". A difference of the set illustrated here with that of FIGS. 4 to 8 is that, to abut against the surface element 3", the mass 2 must perform a translational movement along the same direction only to abut against the surface element 3. The two locking/unlocking systems 5 and 5" and the two respective elastic stoppers 4 and 4" are no longer disposed on either side of the mass 2 along the same direction of translation, but on two distinct directions of translation, a vertical direction $D_1$ and a horizontal direction $D_3$, moreover perpendicular here. The coupling system 6', comprising a slide 61' and two pivot links 62 and 62' on the two respective locking systems 5 and 5', operates in a manner equivalent to the coupling system 6 of FIGS. 4 to 8, except that the movement in translation of the slide is not made on a substantially horizontal axis, but on an axis forming an angle of substantially 45° with the horizontal direction.

FIG. 9 represents a fourth embodiment with an elaborate form, relating to two masses 2a and 2b of a MEMS device, which may or may not constitute the same movable element in motion, each movable along a horizontal direction $D_1$ and along a vertical direction $D_3$.

The mass 2a is damped along the direction $D_1$ toward the right by the locking/unlocking system 5a and the stopper 4a against the element 3a, and along the direction $D_3$ upwards by the locking/unlocking system 5'a and the stopper 4'a against the element 3'a. The mass 2b is damped along the direction $D_3$ downwards by the locking/unlocking system 5b and the stopper 4b against the element 3b, and along the direction $D_1$ toward the left by the locking/unlocking system 5'b and the stopper 4'b against the element 3'b. The system illustrated here has a symmetry along two diagonal axes perpendicular to each other. Each mass is thus damped in only one orientation along each direction of translation.

Furthermore, an elaborate coupling solution 6 is implemented between the four locking/unlocking systems 5a, 5b, 5'a, 5'b. A first slide 61a creates a coupling between the locking/unlocking systems 5a and 5'a, and a second slide 61b creates a coupling between the locking/unlocking systems 5b and 5'b. In addition, an additional degree of freedom of the system formed by the two slides 61a and 61b and their respective pivot links with the four locking/unlocking systems 5a, 5b, 5'a, 5'b is constrained by two slides 61c and 61d, so that the translations of the slide 61a and of the slide 61b are not mutually independent. One effect of this arrangement and of this coupling solution 6 is to couple in real time the rotations of the four locking/unlocking systems 5a, 5b, 5'a, 5'b, so that their respective rotations about their respective pivot links 54a, 54b, 54'a, 54'b respect at all times the symmetry along the two diagonal axes visible in FIG. 9.

The invention claimed is:

1. A damping system for a movable mass (2) of a MEMS device (1),
the system being able to prevent a direct contact between the mass (2) and a surface element (3) of the MEMS device (1), the mass (2) being movable in translation relative to the surface element (3) along a first direction ($D_1$), the damping system comprising:
a mechanical stopper (4) with elastic properties, positioned between the mass (2) and the surface element (3),
the stopper (4) being oriented along a second direction when it is in a rest position ($PB_R$),
a system (5) for locking/unlocking the stopper (4),
wherein the locking/unlocking system (5) comprises:
a branch (51) oriented towards the stopper (4), comprising a blocking end (53),
a pivot link (54) capable of pivoting the branch (51) along an axis (A) of rotation substantially perpendicular to the first direction ($D_1$) and to the second direction,
the locking/unlocking system (5) defining the two following positions of the mass (2) along the first direction ($D_1$) of translation:
a central position ($PM_C$) of the mass (2), the mass (2) being urged in said central position ($PM_C$) by return means (21, 22), each connected to the mass and to a structure of the MEMS device fixed relative to the surface element (3),
a first end position ($PM_1$) where the mass (2) is brought closer to the surface element (3) relative to its central position ($PM_C$), the stopper (4) being pressed towards the surface element (3) along a locked position ($PB_V$), the branch (51) being configured to block the stopper (4) in this locked position ($PB_V$) by its blocking end (53),
the locking/unlocking system being rotatable about the pivot link (54), up to a position where the stopper (4) is not held in the locked position ($PB_V$).

2. The damping system according to claim 1, wherein the locking/unlocking system (5) further comprises a lever (52) secured to the branch (51) and rotatable along the pivot link (54),
the damping system further comprising a protrusion element (23) secured to the mass (2) protruding out of the mass (2) towards the lever (52),
the lever (52) and the protruding element (23) being configured so that, when the mass (2) switches from the central position ($PM_C$) to a second end position ($PM_2$), the lever (52) is driven by the translational movement of the protruding element (23) and rotates the locking/unlocking system (5) about the pivot link (54) up to a position where the stopper (4) is not held in the locked position ($PB_V$).

3. The damping system according to claim 1, further comprising an actuator positioned in the vicinity of the branch (51), capable of driving the branch by active control, rotating it about the pivot link (54) up to a position where the stopper (4) is not held in the locked position ($PB_V$) by the branch.

4. The damping system according to claim 3, wherein the actuator positioned in the vicinity of the branch is an electronically controlled electrostatic actuator.

5. The damping system according to claim 1, wherein the stopper consists of a beam (4) embedded through a beam end on a first surface of the MEMS device secured to the surface element (3), which can also be embedded through a second beam end to a second surface of the MEMS device.

6. A MEMS device of the actuator or sensor type, including a damping system according to claim 1.

7. The MEMS device according to claim 6, wherein the MEMS device includes a plurality of the damping systems.

8. The MEMS device according to claim 7, wherein, to prevent direct contact between the mass (2) and a first surface element (3) as well as a second surface element (3'), the two surface elements (3, 3') being located on either side of the mass (2) along the first direction ($D_1$), the stoppers (4, 4') and the locking/unlocking systems (5, 5') of two damping systems are arranged on either side of the mass (2) along the first direction ($D_1$).

9. The MEMS device according to claim 7, wherein the mass (2) is movable in translation relative to a second surface element (3") along a third direction ($D_3$) distinct from the first direction ($D_1$), a damping system being disposed to prevent direct contact between the mass (2) and the first surface element (3) along the first direction ($D_1$), and another damping system being disposed to prevent direct contact between the mass (2) and the second surface element (3") along the third direction ($D_3$).

10. The MEMS device according to claim 7, further comprising a coupling system (6) between the locking/unlocking systems (5, 5') of two damping systems,
the coupling system being configured so that a rotation of a locking/unlocking system (5) about its pivot (54), such as the stopper (4) associated with said locking/unlocking system (5) is not held in the locked position, drives in rotation the other locking/unlocking system (5') about its pivot (54') up to a position where the stopper (4') associated with this other locking/unlocking system (5') is not held in the locked position either.

11. The MEMS device according to claim 10, wherein the coupling system (6) comprises:
two coupling pivots (62, 62') secured respectively to the two locking/unlocking systems (5, 5'), capable of pivoting respectively the two locking/unlocking systems (5, 5') along an axis (A) of rotation substantially perpendicular to the first direction ($D_1$) and to the second direction,
a slide (61) connected to the two coupling pivots (62, 63) movable mainly in translation.

12. The MEMS device according to claim 8, further comprising a coupling system (6) between the locking/unlocking systems (5, 5') of two damping systems,
the coupling system being configured so that a rotation of a locking/unlocking system (5) about its pivot (54), such as the stopper (4) associated with said locking/unlocking system (5) is not held in the locked position, drives in rotation the other locking/unlocking system (5') about its pivot (54') up to a position where the stopper (4') associated with this other locking/unlocking system (5') is not held in the locked position either,
wherein the levers and the elements secured to the mass of the damping systems are configured so that when the mass (2) switches from the central position ($PM_C$) to the first end position ($PM_1$) of one of the damping systems, the lever (52') of the other damping system is driven by a protrusion element (23') of this other system and rotates the locking/unlocking system (5') of this other system about its pivot link (54') up to a position where the corresponding stopper (4') is not held in the locked position ($PB_V$).

* * * * *